United States Patent
Chiu

(10) Patent No.: US 6,496,052 B1
(45) Date of Patent: Dec. 17, 2002

(54) VERY LOW TEMPERATURE COEFFICIENT FOR CURRENT LIMIT IN SWITCHING REGULATOR AND DRIVER

(75) Inventor: Kwok-Fu Chiu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/953,382

(22) Filed: Sep. 10, 2001

(51) Int. Cl.$^7$ ................................................ H03K 17/78

(52) U.S. Cl. ........................................ 327/513; 327/512

(58) Field of Search ................................ 327/512, 513, 327/63, 378; 323/282

(56) References Cited

U.S. PATENT DOCUMENTS

| | | | | |
|---|---|---|---|---|
| 4,484,089 A | * | 11/1984 | Viswanathan | 327/337 |
| 5,825,234 A | * | 10/1998 | Sung et al. | 327/378 |
| 6,366,068 B1 | * | 4/2002 | Morishita | 323/282 |
| 6,441,674 B1 | * | 8/2002 | Lin | 327/512 |

OTHER PUBLICATIONS

"A New Integrated Circuit for Current Mode Control," Unitrode Application Note U–93 (1997), pp. 3–1 to 3–8.

* cited by examiner

Primary Examiner—Timothy P. Callahan
Assistant Examiner—Linh Nguyen
(74) Attorney, Agent, or Firm—Brett A. Hertzberg; Merchant & Gould

(57) ABSTRACT

A method and apparatus is directed to generating an improved temperature coefficient for the current limit in a switching regulator/driver circuit. The current limit sense circuit includes a comparator that compares two signals to determine when the current limit has been exceeded. One signal is produced from a temperature independent voltage source, a trans-conductance cell, and a sensor resistor circuit. Another signal is produced by an active output circuit, such that the signal corresponds to the current associated with the switching regulator/driver circuit. The current sensed by the regulator/driver is temperature dependent due to the resistances in the active output circuit, the sensor resistor circuit, and the trans-conductance cell. Each of these resistances has a temperature coefficient. The temperature coefficients determine the amount of temperature dependence in the sensed switching/regulator current. The resistance materials are chosen such that the temperature dependence of the sensed current is minimized.

14 Claims, 6 Drawing Sheets

VERY LOW TEMPERATURE COEFFICIENT FOR CURRENT LIMIT IN SWITCHING REGULATOR AND DRIVER

FIELD OF THE INVENTION

The present invention relates to switching regulators and driver circuits. In particular, the present invention relates to a method and apparatus that provides for an improved temperature coefficient for the current limit in a switching regulator circuit. The improved temperature coefficient in the current limit may also be employed for use in a driver circuit such as an RS-232 driver.

BACKGROUND OF THE INVENTION

Current limit is an important parameter for switching regulator and driver circuits. A precisely controlled value for the current limit in a wide temperature range is always desired. An example of a current sensor circuit (100) that may be used in a switching regulator circuit is shown in FIG. 1. Switching regulator circuit 100 includes a comparator (110), a differential gain amplifier (120), a reference voltage ($V_{REF}$), a bi-polar junction transistor (BJT) ($Q_1$), a diode ($D_1$), an internal voltage reference ($V_{REF(I)}$), a sense resistor ($R_S$), and two resistors ($R_1$ and $R_2$).

Comparator 110 includes a sensor input (SNS) that is coupled to node $N_{10}$, a reference input (REF) that is coupled to node $N_{11}$, and an output that is coupled to node $N_{16}$. Differential gain amplifier 120 includes differential inputs that are coupled to node $N_{12}$ and power supply node $N_{PS10}$, and an output that is coupled to node $N_{10}$. Internal voltage reference $V_{REF(I)}$ is coupled between node $N_{11}$ and node $N_{13}$. Diode $D_1$ is coupled between node $N_{13}$ and node $N_{14}$. Transistor $Q_1$ includes a base that is coupled to node $N_{15}$, an emitter that is coupled to node $N_{14}$, and a collector that is coupled to power supply node $N_{PS11}$. Resistor $R_1$ is coupled between node $N_{15}$ and power supply node $N_{PS12}$. Resistor $R_2$ is coupled between node $N_{15}$ and power supply node $N_{PS11}$.

The resistors ($R_1$, $R_2$) operate as a voltage divider. In this example, sense resistor $R_S$ is located "off-chip" as can be resistors $R_1$ and $R_2$. A circuit ground potential (GND) is coupled to power supply node $N_{PS11}$.

In operation, comparator 110 produces an output signal when the voltage signal level at node $N_{10}$ exceeds the signal level at node $N_{11}$. Differential gain amplifier 120 produces the output signal based on the voltage drop across the sense resistor ($R_S$). The voltage drop across the sense resistor ($R_S$) is equal to the product of the value of the sense current ($I_S$) and the value of the sense resistor ($R_S$). The differential gain amplifier (120) then takes the resulting voltage value ($I_S \cdot R_S$) and scales it (e.g., ×3). This scaled value is outputted by differential gain amplifier 120 at node $N_{10}$. The sensor input (SNS) receives a signal from the output of the differential gain amplifier (120).

Similarly, the reference input (REF) receives a signal from the output of transistor $Q_1$. Transistor $Q_1$ produces the signal based on the voltage present across resistor ($R_2$) of the voltage divider ($R_1$, $R_2$) due to the reference voltage ($V_{REF}$). Diode $D_1$ provides an offset to compensate for the voltage drop ($V_{BE}$) across the base-emitter junction. The internal reference ($V_{REF(2)}$) voltage is provided as a design adjustment. Therefore, the signal received at the reference input (REF) of the comparator (110) is proportional to the reference voltage ($V_{REF(1)}$). The equation for the switching regulator circuit (100) of FIG. 1, when the sensor current ($I_S$) is at its peak value, can be expressed as follows:

$$3 \cdot I_S \cdot R_S = [(R_2 \cdot V_{REF(1)})/(R_1+R_2)] - V_{REF(2)}$$

$$I_S = \{[(R_2 \cdot V_{REF(1)})/(R_1+R_2)] - V_{REF(2)}\}/(3 \cdot R_S)$$

The value of $I_S$ depends on the ratio of $R_2/(R_1+R_2)$, the value of $V_{REF(1)}$ and $V_{REF(2)}$, and $R_S$. Assuming $V_{REF(1)}$ and $V_{REF(2)}$ have no appreciable temperature coefficient, the temperature coefficient of $I_S$ is only dependent upon the temperature coefficient of $R_S$. $R_S$ may be an equivalent resistance such as the on resistance ($R_{DS(ON)}$) of a MOSFET transistor in a switching regulator. In this instance, the $I_S \cdot R_S$ has a large temperature coefficient that is on the order of 4000 ppm/° C., which is intolerable in some applications.

SUMMARY OF THE INVENTION

The present invention is directed to a method and an apparatus that improves the temperature coefficient for the current limit in a switching regulator, and also in driver circuits. An improved switching regulator/driver circuit includes "on-chip" resistance circuits that allow for a reduced temperature coefficient associated with the current limit. The improved temperature coefficient of the current limit may be arranged to provide for a constant current limit in the switching regulator or driver circuit. High output currents are limited over a wide range of temperature changes, providing for improved protection to the switching regulator or driver circuit.

Briefly stated, a method and apparatus is provided that is directed to generating an improved temperature coefficient for the current limit in a switching regulator circuit. A current limit sense circuit is employed that includes a comparator that compares two signals to determine when the current limit has been exceeded. One signal is produced from an input voltage source that has no temperature coefficient, a trans-conductance cell, and a sensor resistor circuit. An active output circuit produces another signal that corresponds to the current associated with the switching regulator circuit. The current sensed by the regulator is temperature dependent due to the resistances in the active output circuit, the sensor resistor circuit, and the trans-conductance cell. Each of these resistances has a temperature coefficient. The sum of the temperature coefficients determines the amount of temperature dependence in the sensed switching regulator circuit current. The resistance materials are chosen such that the temperature dependence of the sensed current is minimized. Also, all resistors are integrated into a single chip, reducing the costs associated with external pins and external resistor components. A similar arrangement may be applied to a driver circuit with a limited current output.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

The present invention relates to switching regulator and driver circuits. More particularly, the present invention relates to a method and apparatus that provides for a reduced temperature coefficient for the current limit sensor in a switching regulator/driver circuit. The present invention has determined that a need exists for an integrated circuit switching regulator/driver that eliminates the use of one or more "off-chip" resistors. By eliminating "off-chip" resistor elements, power consumption can be reduced and overall cost is reduced. The present invention utilizes an active element as the sense resistor ($R_S$). The active element reduces the "chip area" that is necessary to provide the required sense resistor ($R_S$). The active sense resistor ($R_S$) eliminates the need for an external ("off-chip") resistor.

Figure 1:
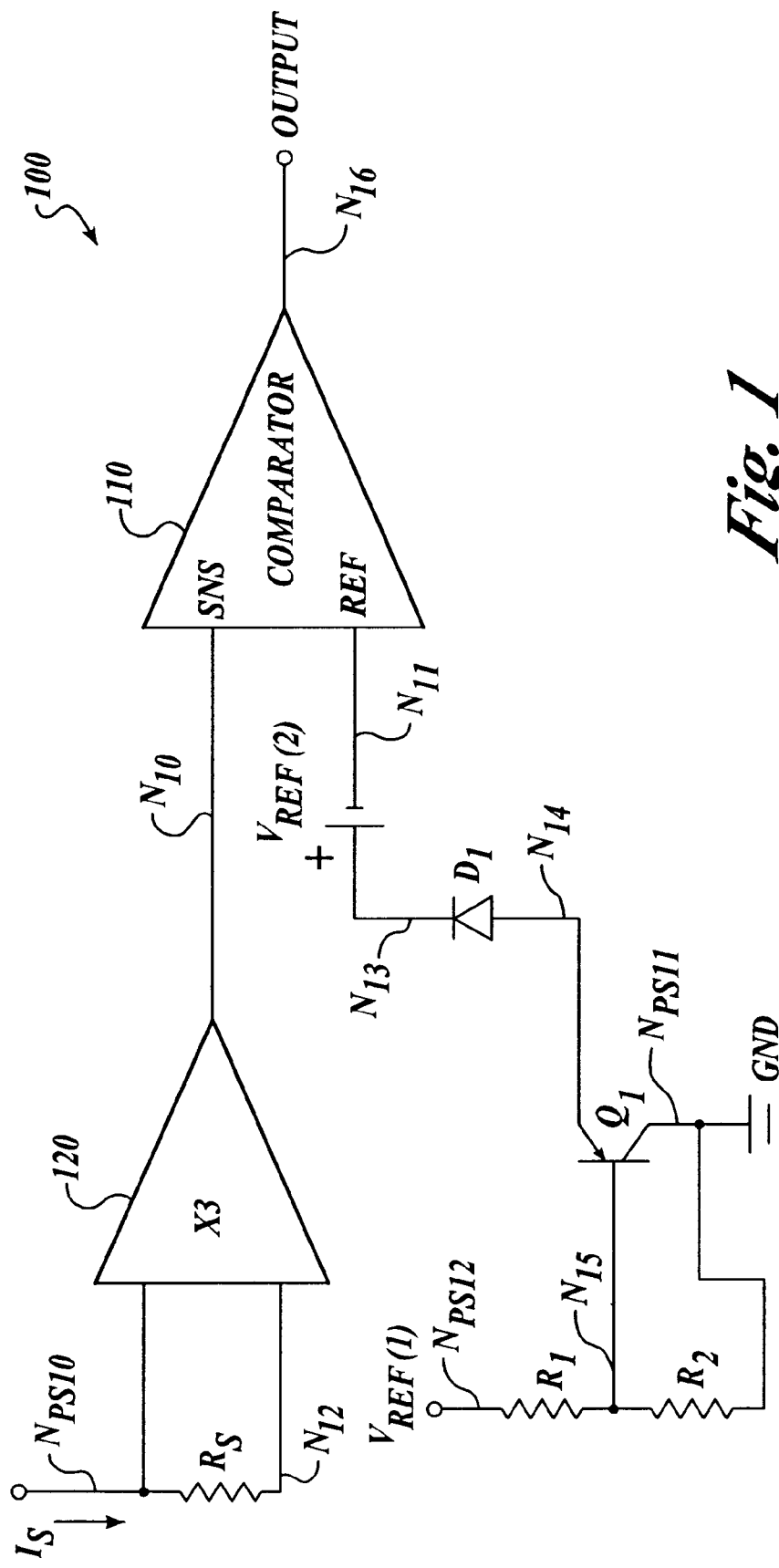
FIG. 1 is a schematic diagram illustrating a sensor circuit in a conventional switching regulator circuit.
Figure 2:
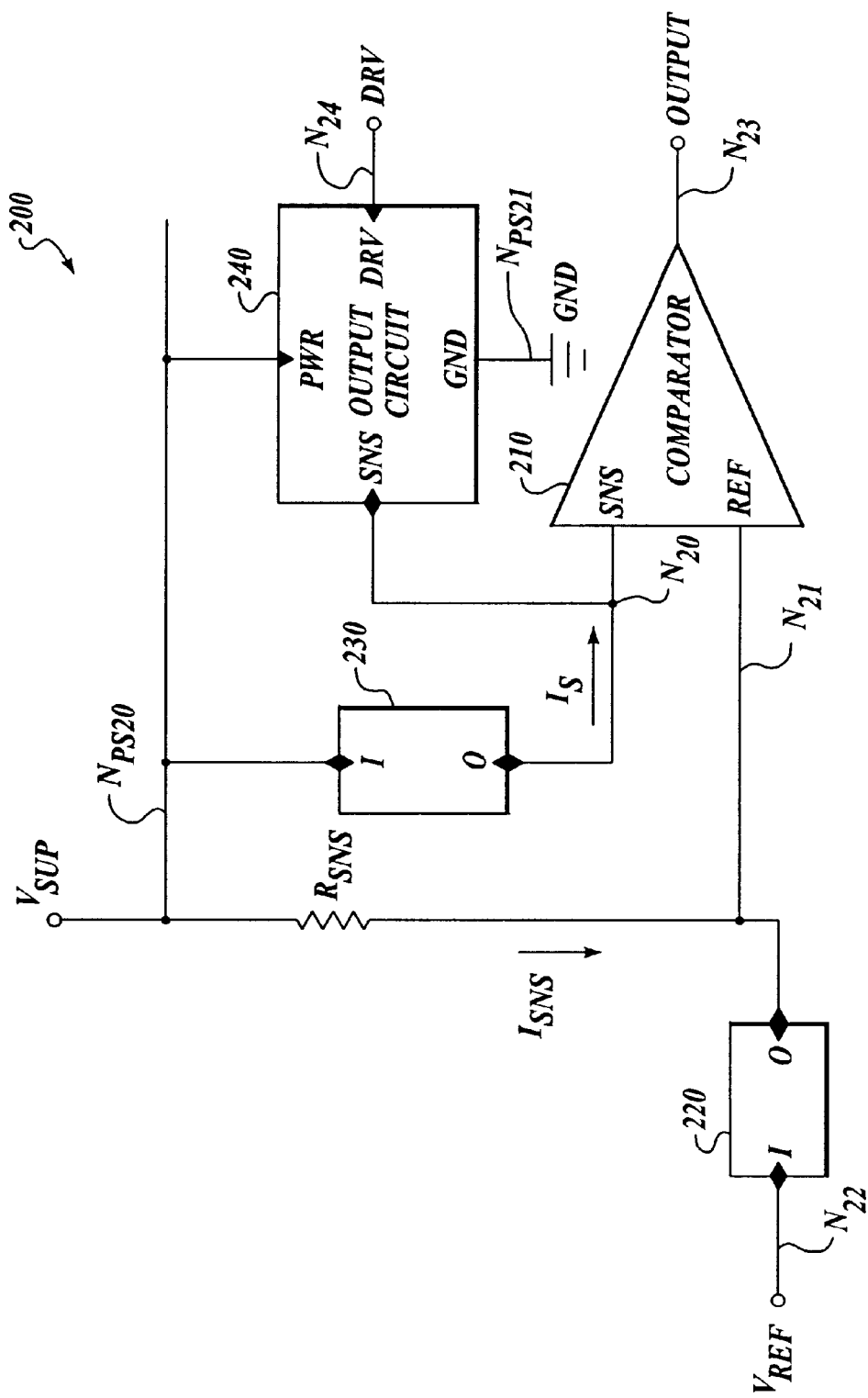
FIG. 2 is a schematic diagram illustrating an improved sensor circuit in a switching regulator circuit that includes a reduced temperature coefficient for the current limit in accordance with an embodiment of the present invention.

FIG. 2 is a schematic diagram illustrating an example of a switching regulator sensor circuit (200) that is in accordance with the present invention. In FIG. 2, the switching regulator sensor circuit (200) includes a comparator circuit (210), a converter circuit (220), a sensor circuit (230), an output circuit (240), and a sense resistor ($R_{SNS}$).

Comparator circuit 210 includes a differential input having a sensor input (SNS) that is coupled to node $N_{20}$, a reference input (REF) that is coupled to node $N_{21}$, and an output that is coupled to node $N_{23}$. A system output (Output) is coupled to node $N_{23}$. Converter circuit 220 includes an output terminal (O) that is coupled to node $N_{21}$ and an input terminal (I) that is coupled to node $N_{22}$. In one embodiment, converter circuit 220 is a trans-conductance cell. Sense resistor $R_{SNS}$ is coupled between node $N_{21}$ and power supply node $N_{PS20}$. Sensor circuit 230 includes an input terminal (I) that is coupled to power supply node $N_{PS20}$ and an output terminal (O) that is coupled to node $N_{20}$. Sensor element 230 includes a resistance. Output circuit 240 includes a sense terminal (SNS) that is coupled to node $N_{20}$, a power terminal (PWR) that is coupled to power supply node $N_{PS20}$, a driver terminal (DRV) that is coupled to node $N_{24}$, and a ground terminal (GND) that is coupled to a circuit ground potential (GND). In one embodiment, output circuit 240 is a voltage-controlled current source.

In operation, a signal is coupled from a temperature independent reference voltage ($V_{REF}$) to node $N_{22}$, and a supply voltage ($V_{SUP}$) is coupled to power supply node $N_{PS20}$. Converter circuit 220 produces a reference signal at node $N_{21}$ based on the signal received at node $N_{22}$. The signal received at node $N_{21}$ is coupled to the reference input (REF) of comparator 210. Sensor element 230 produces a signal at node $N_{20}$ in response to the power supply voltage ($V_{SUP}$) and a current ($I_S$). The signal received at node $N_{20}$ is coupled to the sensor input (SNS) of comparator 210. The value of the current ($I_S$) is dependent on the output circuit (240). The value of the current ($I_S$) at node $N_{20}$ is dependent on the value of a signal received at the power terminal (PWR) in conjunction with a signal received at the drive terminal (DRV) of output circuit 240.

Comparator 210 produces an output signal at node $N_{23}$ in response to the signals at nodes $N_{20}$, $N_{21}$. The voltage signal at the reference input (REF) is equal to the supply voltage ($V_{SUP}$) less the drop across the sense resistor ($R_{SNS}$). The voltage drop across sense resistor $R_{SNS}$ is equal to the product of sensor current ($I_{SNS}$), flowing through the sense resistor ($R_{SNS}$), and the value of the sensor resistor ($R_{SNS}$). The value of the sensor current ($I_{SEN}$) is equal to the product of the temperature independent reference voltage ($V_{REF}$) and the value of the trans-conductance of converter circuit 220. Therefore, the potential of the signal at node $N_{21}$, is given by:

$$V_{21} = V_{SUP} - (I_{SNS} \cdot R_{SNS})$$

where:

$$I_{SNS} = (V_{REF} \cdot g_M),$$

and $$V_{21} = V_{SUP} - ((V_{REF} \cdot g_M) \cdot R_{SNS})$$

Similarly, the potential at node $N_{20}$ is determined by the supply voltage ($V_{SUP}$) and the voltage drop across the sensor element (230). Sensor element 230 has an associated resistance ($R_S$). The voltage drop across sensor circuit 230 is determined by the current ($I_S$) that is flowing through the sensor circuit (230), and the value of a resistance ($R_S$ associated with the sensor circuit (230). Current $I_S$ is determined by the output circuit (240). Therefore, the potential of the signal at node $N_{20}$, is given by:

$$V_{20} = V_{SUP} - (I_S \cdot R_S)$$

where $I_S$ is proportional to the current flowing in the output circuit (240).

The output of the comparator circuit (210) changes logic states when the potential ($V_{20}$) of at node $N_{20}$ substantially reaches (or exceeds) the potential ($V_{21}$) at node $N_{21}$. The peak value for the sensor current ($I_S$) occurs when potential $V_{20}$ equals potential $V_{21}$. Thus, the sensor current ($I_S$) is determined by:

$$V_{21} = V_{20}$$

$$((V_{REF} \cdot g_M) \cdot R_{SNS}) = (I_S \cdot R_S)$$

$$I_S = ((V_{REF} \cdot g_M) \cdot R_{SNS})/R_S$$

where $I_S$ is the peak sensor current.

Although $V_{REF}$ is temperature independent, the various resistances ($R_{SNS}$, $R_S$) and trans-conductance ($g_M$) by their very nature have temperature dependent resistances. The present invention seeks to control a current limit ($I_S$) that is temperature independent.

Figure 3:
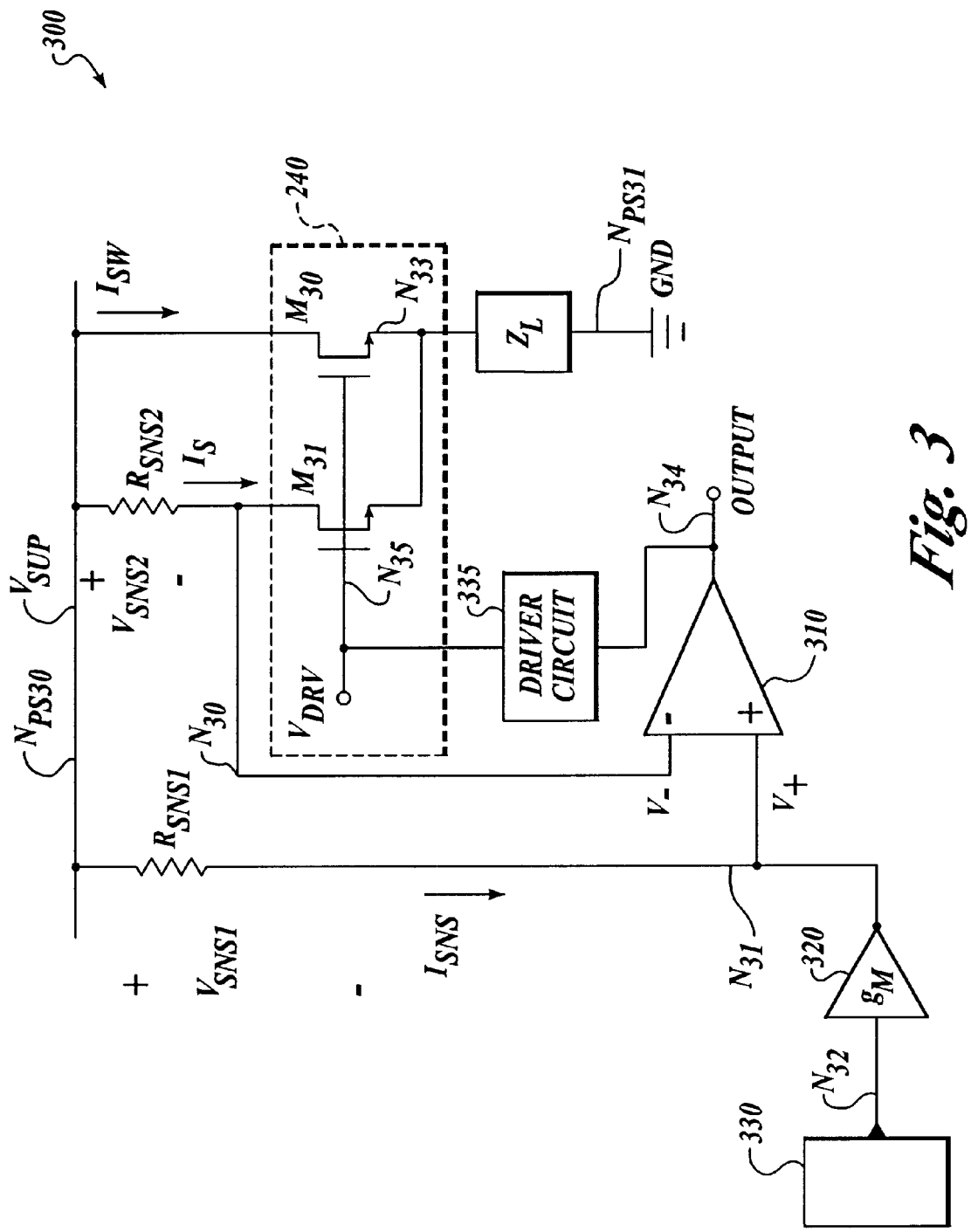
FIG. 3 is a schematic diagram illustrating an improved sensor circuit in a switching regulator circuit that includes a reduced temperature coefficient for the current limit in accordance with another embodiment of the present invention.

FIG. 3 is a schematic diagram illustrating an example of a switching regulator sensor circuit (300) that is in accordance with the present invention. In FIG. 3, the switching regulator sensor circuit (300) includes a comparator circuit (310), a trans-conductance cell (320), a voltage source (330), a driver circuit (335), an output circuit (240), a load ($Z_L$), and two resistors ($R_{SNS1}$ and $R_{SNS2}$). Output circuit 240 further includes two transistors ($M_{30}$, $M_{31}$).

Comparator circuit 310 includes a non-inverting input (+) that is coupled to node $N_{31}$, an inverting input (−) that is coupled to node $N_{30}$, and an output terminal that is coupled to node $N_{34}$. Trans-conductance cell 320 includes an output that is coupled to node $N_{31}$ and an input that is coupled to node $N_{32}$. Voltage source 330 includes an output that is coupled to node $N_{32}$. Resistor $R_{SNS1}$ is coupled between node $N_3$, and power supply node $N_{PS30}$. Driver circuit 335 includes an input that is coupled to node N34 and an output that is coupled to node N35.

Resistor $R_{SNS2}$ is coupled between node $N_{30}$ and power supply node $N_{PS30}$. Transistor $M_{31}$ includes a drain that is coupled to node $N_{30}$, a gate that is coupled to node $N_{35}$, and a source that is coupled to node $N_{33}$. Transistor $M_{30}$ includes a gate that is coupled to node $N_{35}$, a source that is coupled to node $N_{33}$, and a drain that is coupled to power supply node $N_{PS30}$. In this configuration, transistor $M_{30}$ is referred to as a "switch transistor." Load $Z_L$ is coupled between node $N_{33}$ and power supply node $N_{PS31}$. A circuit ground potential (GND) is coupled to power supply node $N_{PS30}$.

The components of FIG. 3 function similarly to like named components in FIG. 2. Driver circuit 335 is arranged to drive transistors $M_{30}$ and $M_{31}$ when the circuit is configured to operate as a regulator. Transistor $M_{30}$ represents an output driver that drives current into load $Z_L$, while transistor $M_{31}$ (sharing a common gate and source with transistor $M_{30}$) provides a current ($I_S$) that is representative of the current that is driven into load $Z_L$. Transistor $M_{31}$ and resistor $R_{SNS2}$ operate as a current sense circuit that provides a voltage corresponding to the current that is driven into load $Z_L$.

Comparator circuit 310 changes the logic state of its output when an over current condition occurs. The over current condition may be used to shut down the driver circuit (335) such that transistors $M_{30}$ and $M_{31}$ are disabled. By disabling transistors M30 and M31, the output current that is delivered to load $Z_L$ is limited.

The over current condition is detected by comparator circuit 310 when the potential at node $N_{30}$ equals (or exceeds) the potential at node $N_{31}$. The potential of at node $N_{31}$ is obtained utilizing the same method employed in deriving the value of the voltage present at node $N_{21}$ of FIG. 2. Therefore, the potential of the signal ($V_+$) at the noninverting input (+) of comparator circuit 310 is:

$$V_+ = V_{SUP} - V_{SNS1}$$

where $V_{SNS1}$ represents the voltage drop across resistor $R_{SNS1}$.

$$V_+ = V_{SUP} - (I_{SNS} \cdot R_{SNS1})$$

where $I_{SNS} = (V_{REF} \cdot g_M)$ $$V_+ = V_{SUP} - [(V_{REF} \cdot g_M) \cdot R_{SNS1}]$$

where $V_{REF}$ is the voltage signal produced by voltage source 330.

In one example, voltage source 330 is a band gap type of reference circuit. Voltage source 330 may also be derived from another circuit. Trans-conductance cell 320 and voltage source 330 may be combined into a single circuit. Also, other circuitry (not shown) in the switching regulator or driver circuit may be utilized to provide the voltage at node $N_{32}$.

The potential of node $N_{30}$ is obtained utilizing a similar method employed in deriving the potential at node $N_{20}$ of FIG. 2. The potential of node $N_{30}$ ($V_−$) is equal to the difference of a supply voltage ($V_{SUP}$) and the voltage drop ($V_{SNS2}$) across resistor $R_{SNS2}$. The voltage drop across resistor $R_{SNS2}$ is equal to the product of the current ($I_S$) flowing in resistor $R_{SNS2}$ and resistance of the resistor ($R_{SNS2}$). In one embodiment, the resistance of resistor $R_{SNS2}$ is much greater than the resistance across the drain-source ($R_{DSON(M31)}$) of $M_{31}$ when the transistor is "on" (i.e., at least ten times greater). The current ($I_S$) flowing in transistor $M_{31}$ is proportional to an output circuit current ($I_{SW}$) flowing in transistor $M_{30}$. A further property of this embodiment is that the potential across the drain-source ($R_{DSON(M30)}$) of transistor $M_{30}$ is approximately equal to the potential across resistor $R_{SNS2}$.

The value of the load ($Z_L$) and a driver voltage ($V_{DRV}$) applied to the gates of the transistors ($M_{30}$ and $M_{31}$) determines the value of the output circuit current ($I_{SW}$). Changes in either the load ($Z_L$) or the driver voltage ($V_{DRV}$) cause a corresponding change in the potential ($V_−$) at node $N_{30}$. When the voltage signal levels of the differential inputs of comparator 310 are approximately equal, the comparator circuit (310) will trip. Hence, the output circuit can be determined by:

$$V_+ = V_−$$

Substituting from the above equations and text results in $$V_{SUP} - (I_{SNS} \cdot R_{SNS}) = V_{SUP} - [(R_{DSON(M30)}) \cdot I_{SW}]$$

$$(I_{SNS} \cdot R_{SNS}) = (R_{DSON(M30)}) \cdot I_{SW}$$

where $$I_{SNS} = V_{REF} \cdot g_M$$

Further substitutions result in $$(V_{REF} \cdot g_M) \cdot R_{SNS} = (R_{DSON(M30)}) \cdot I_{SW}$$

Solving for the output circuit current ($I_{SW}$) yields $$I_{SW} = V_{REF} \cdot g_M \cdot R_{SNS} / (R_{DSON(M30)})$$

For simplicity, the trans-conductance value of $g_M$ can be represented as an equivalent resistance value $R_{EQ}$, where $R_{EQ} = 1/g_M$. Thus, $I_{SW}$ is given by:

$$I_{SW} = V_{REF} \cdot (R_{SNS}) / (R_{DSON(M30)}) \cdot R_{EQ}$$

When making an allowance for temperature considerations, each resistance includes its inherent resistance value (R) plus a temperature coefficient ($\alpha \cdot T$). This resistance is represented as:

$$R(T) = R_0 \cdot (1 + \alpha_R \cdot T)$$

giving:

$$R_{SNS}(T) = R_{SNS} \cdot (1 + \alpha_{SNS} \cdot T)$$

$$R_{DSON}(T) = R_{DSON} \cdot (1 + \alpha_{DSON} \cdot T)$$

$$R_{EQ}(T) = R_{EQ} \cdot (1 + \alpha_{EQ} \cdot T)$$

Substituting for a temperature dependent equation yields $$I_{SW}(T)=V_{REF}\cdot[R_{SNS}\cdot(1+\alpha_{SNS}\cdot T)/R\cdot(1+\alpha_{EQ}\cdot T)\cdot(R_{DSON})\cdot(1+\alpha_{DSON}\cdot T)]$$

Linearizing the equation yields $$I_{SW}(T)=V_{REF}\cdot[(R_{SNS})/R_{EQ}\cdot(R_{DSON})]\cdot[1+(\alpha_{SNS}-\alpha_{EQ}-\alpha_{DSON})\cdot T]$$

To obtain a temperature independent output current ($I_{SW}$), the values of the sum of the temperature coefficients ($\alpha$) should equal zero or equal a value as close to zero as possible.

$$(\alpha_{SNS}-\alpha_{EQ}-\alpha_{DSON})=0$$

The temperature coefficient values ($\alpha$) are determined by the materials used to construct the resistors (e.g., passive device), or the type of materials in the active device (e.g., equivalent resistance). For example, a suitable coefficient for $R_{DSON}$ when utilizing a MOSFET type device could be 5000 ppm/° C. A suitable coefficient for $R_{SNS}$ when utilizing a well type resistor could be 6000/° C. Similarly, a suitable coefficient for $R_{EQ}$ (the equivalent resistance of the trans-conductance cell circuit (320)) when utilizing a heavily doped resistor could be 1000/° C. In one embodiment, complementary material types are used for the resistors in the above description such that the value of the difference of temperature coefficients of the two sensor resistors ($\alpha_{SEN}-\alpha_R$) is close to or equal to the temperature coefficient value of the "switch" transistor ($\alpha_{DSON}$). In such an embodiment, the output circuit current ($I_{SW}$) temperature coefficient could be close to zero.

Figure 4:
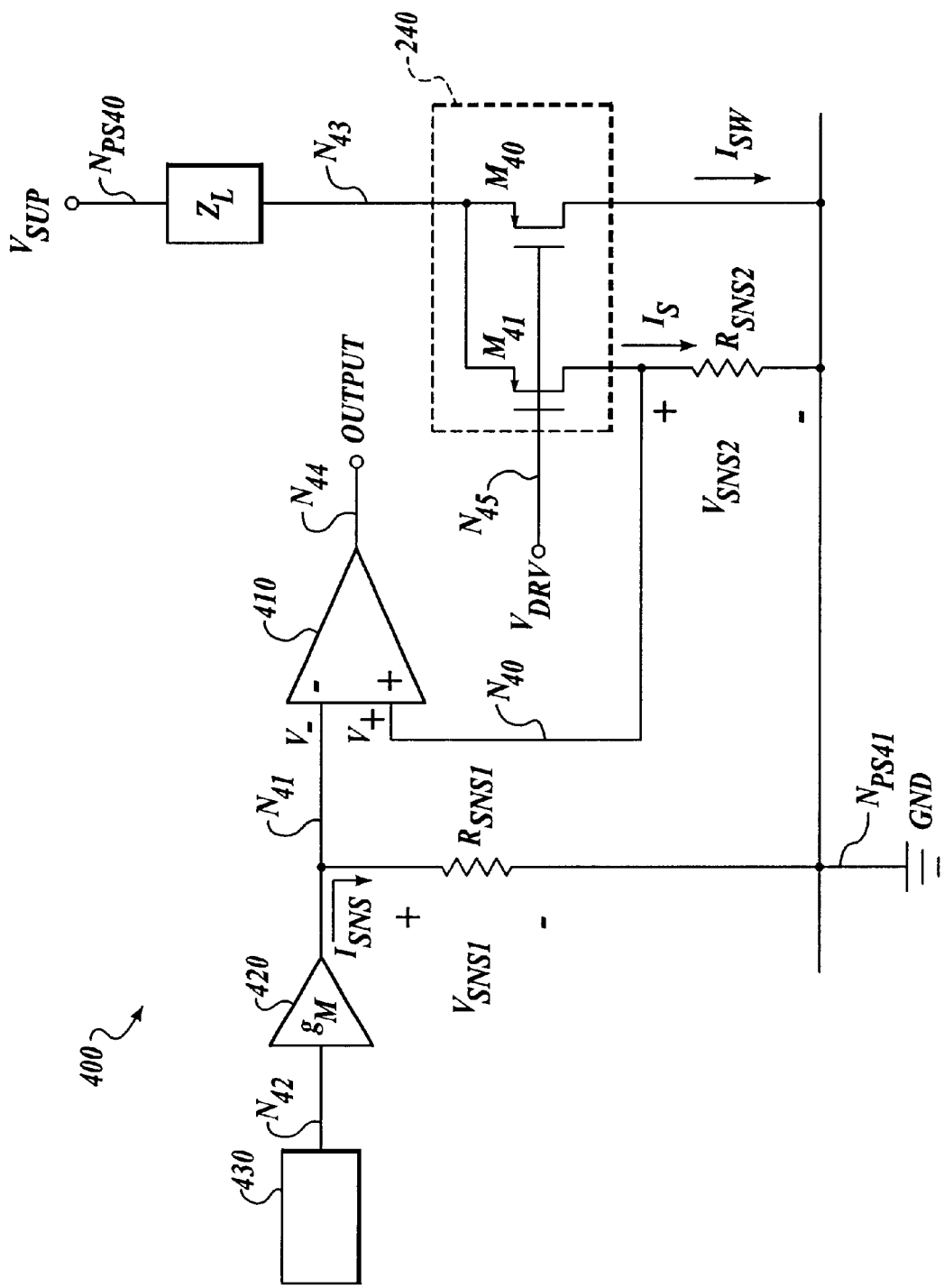
FIG. 4 is a schematic diagram illustrating an improved sensor circuit in a switching regulator circuit that includes a reduced temperature coefficient for the current limit in accordance with yet another embodiment of the present invention.

FIG. 4 is a schematic diagram illustrating an example of another switching regulator sensor circuit (400) that is in accordance with the present invention. In FIG. 4, the switching regulator sensor circuit (400) includes a comparator circuit (410), a trans-conductance cell (420), a temperature independent voltage source (430), an output circuit (240), a load ($Z_L$), and two resistors ($R_{SNS1}$, $R_{SNS2}$). Output circuit 240 further includes two transistors ($M_{40}$, $M_{41}$)

Comparator circuit 410 includes a non-inverting input (+) that is coupled to node $N_{40}$, an inverting input (−) that is coupled to node $N_{41}$, and an output that is coupled to node $N_{44}$. Trans-conductance cell 420 includes an output that is coupled to node $N_{41}$ and an input that is coupled to node $N_{42}$. Temperature independent voltage source 430 includes an output that is coupled to node $N_{42}$. Resistor $R_{SNS1}$ is coupled between node $N_{41}$ and power supply node $N_{PS41}$. Resistor $R_{SNS2}$ is coupled between node $N_{40}$ and power supply node $N_{PS41}$. Transistor $M_{41}$ includes a drain that is coupled to node $N_{40}$, a gate that is coupled to node $N_{45}$, and a source that is coupled to node $N_{43}$. Transistor $M_{40}$ includes a gate that is coupled to node $N_{45}$, a source that is coupled to node $N_{43}$, and a drain that is coupled to power supply node $N_{PS41}$. Load $Z_L$ is coupled between node $N_{43}$ and power supply node $N_{PS40}$. A supply voltage ($V_{SUP}$) is coupled to power supply node $N_{PS40}$. A circuit ground potential (GND) is coupled to power supply node $N_{PS41}$.

The configuration of the switching regulator sensor circuit (400) of FIG. 4 functions similarly to the switching regulator sensor circuit (300) of FIG. 3. The components of FIG. 4 function similarly to like named components in FIG. 3. In operation, the transistors ($M_{40}$, $M_{41}$) of switching regulator sensor circuit (400) are p-type transistors in contrast to the n-type transistors shown in the other switching regulator sensor circuit (300). Due to the inherent properties of the active devices used in FIGS. 3 and 4, the temperature coefficient equation for switching regulator sensor circuit 400 is substantially the same as the equation derived above for switching regulator sensor circuit 300. The temperature coefficient equation utilized to obtain a temperature independent current for switching regulator sensor circuit 400 is:

$$(\alpha_{SNS}-\alpha_{EQ}-\alpha_{DSON})=0$$

The temperature coefficient values ($\alpha$) are determined by the materials used to construct the resistors, or the type of materials used to construct the active devices (e.g., transistors $M_{40}$, $M_{41}$).

Figure 5:
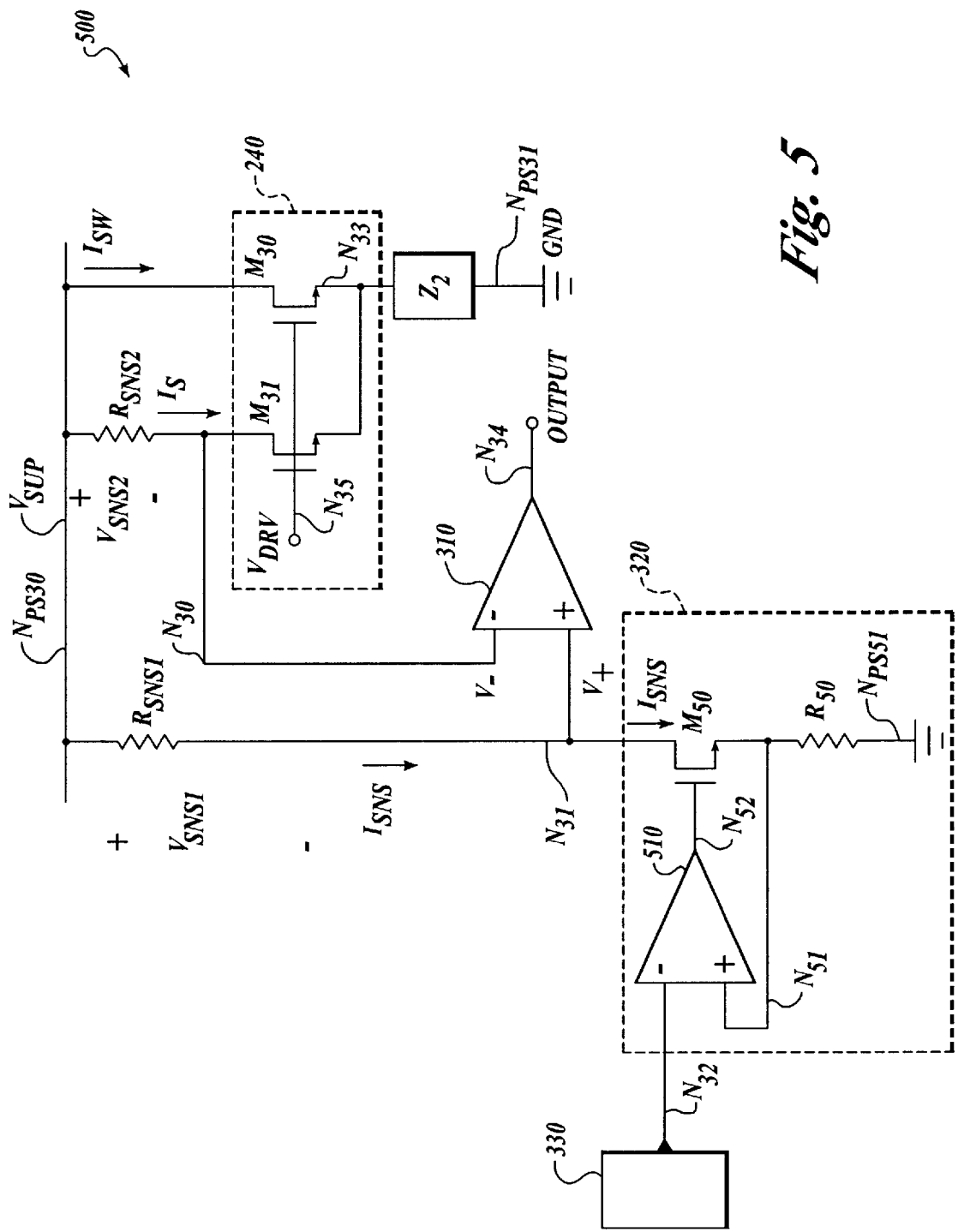
FIG. 5 is a schematic diagram illustrating an improved sensor circuit shown in further detail in accordance with another embodiment of the present invention.

FIG. 5 illustrates another embodiment of the present invention. Like components from FIGS. 3 and 5 are labeled identically. FIG. 5 is a schematic diagram illustrating one embodiment of a switching regulator sensor circuit (500). Switching regulator sensor circuit 500 includes a comparator circuit (310), a trans-conductance cell (320), a temperature independent voltage source (330), an output circuit (240), a load ($Z_L$), and two resistors ($R_{SNS1}$ and $R_{SNS2}$). Trans-conductance cell circuit 320 further includes an operational amplifier (510), a transistor ($M_{50}$), and a resistor ($R_{50}$). Output circuit 240 further includes two transistors ($M_{30}$, $M_{31}$). Refer to FIG. 3 and the related discussion for the overall operation and connections of the like designated components.

Operational amplifier 510 includes a non-inverting input (+) that is coupled to node $N_{50}$, an inverting input (−) that is coupled to node $N_{51}$, and an output that is coupled to node $N_{52}$. Transistor $M_{50}$ includes a gate that is coupled to node $N_{52}$, a source that is coupled to node $N_{51}$, and a drain that is coupled to node $N_{53}$. Resistor $R_{50}$ is coupled between node $N_{51}$ and power supply node $N_{PS51}$. Load $Z_L$ is coupled between node $N_{53}$ and power supply node $N_{PS50}$. A supply voltage ($V_{SUP}$) is coupled to power supply node $N_{PS50}$. A circuit ground potential (GND) is coupled to power supply node $N_{PS51}$.

In operation, a reference signal is coupled from temperature independent reference voltage (330) to node $N_{32}$. In one embodiment, temperature independent reference voltage (330) is a band gap reference. Operational amplifier 510 compares the reference signal to a feedback signal at node $N_{51}$ and produces an output at node $N_{52}$ based on the comparison. Transistor $M_{50}$ produces a current ($I_{SNS}$) in response to the potential at node $N_{52}$ and the potential at node $N_{51}$. The current ($I_{SNS}$) flows through the resistor ($R_{50}$) to produce the feedback signal. When the potential at node $N_{32}$ and node $N_{51}$ are approximately equal, the current ($I_{SNS}$) is approximately given by:

$$I_{SNS}=V_{REF}/R_{50}$$

In this way, trans-conductance cell 320 functions as a voltage to current converter. Resistor $R_{50}$ operates similar to $R_{EQ}$ previously described with respect to FIG. 3.

Figure 6:
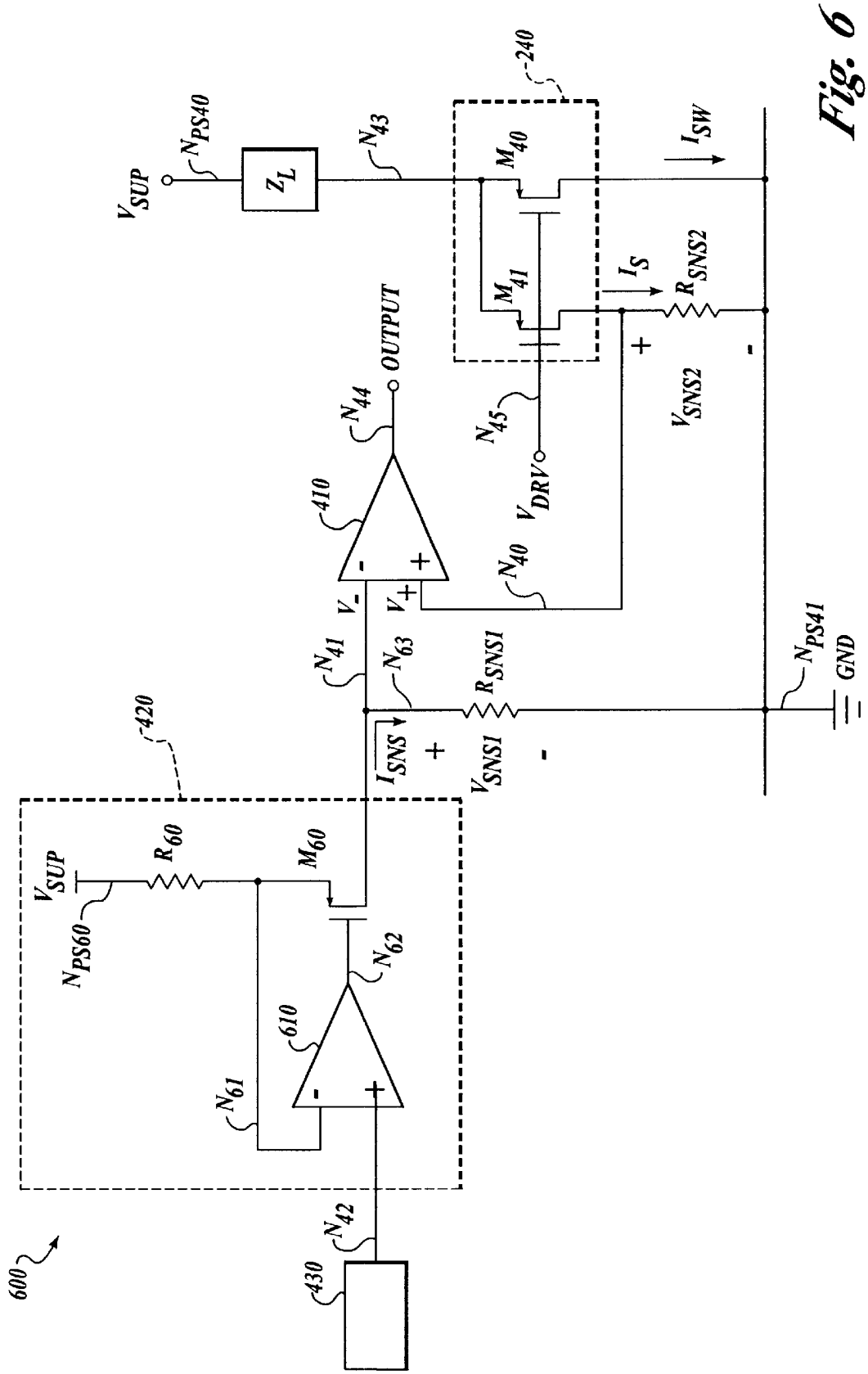
FIG. 6 is a schematic diagram illustrating an improved sensor circuit shown in further detail in accordance with yet another embodiment of the present invention.

FIG. 6 illustrates another embodiment of the present invention. Like components from FIGS. 4 and 6 are labeled identically. FIG. 6 is a schematic diagram illustrating an embodiment of a switching regulator sensor circuit (600). Switching regulator sensor circuit 600 includes a comparator circuit (410), a trans-conductance cell circuit (420), a temperature independent voltage source (430), an output circuit (240), a load ($Z_L$), and two resistors ($R_{SNS1}$, $R_{SNS2}$). Trans-conductance cell circuit 420 further includes an operational amplifier (610), a transistor ($M_{60}$), and a resistor ($R_{60}$). Output circuit 240 further includes two transistors ($M_{40}$, $M_{41}$). Refer to FIG. 4 and the related discussion for the overall operation and connections of the like designated components.

Operational amplifier 610 includes a non-inverting input (+) that is coupled to node $N_{60}$, an inverting input (−) that is coupled to node $N_{61}$, and an output that is coupled to node $N_{62}$. Transistor $M_{60}$ includes a gate that is coupled to node $N_{62}$, a drain that is coupled to node $N_{61}$, and a source that is coupled to node $N_{63}$. Resistor $R_{60}$ is coupled between node $N_{61}$ and power supply node $N_{PS60}$. Load $Z_L$ is coupled between node $N_{63}$ and power supply node $N_{PS61}$. A supply voltage ($V_{SUP}$) is coupled to power supply node $N_{PS60}$. A circuit ground potential (GND) is couple to power supply node $N_{PS61}$.

The configuration of the switching regulator sensor circuit (600) of FIG. 6 functions similarly to the switching regulator sensor circuit (500) of FIG. 5. The components of FIG. 6 function similarly to like named components in FIG. 5. In operation, the active components of switching regulator sensor circuit (600) are p-channel type in contrast to the n-channel type of the switching regulator sensor circuit (500).

Although active circuits, such as, voltage-controlled current sources, trans-conductance cells, comparators, etc include FET's in the above description, it is understood and appreciated that other active devices could be used as well. For example, NPN transistors, PMOS transistors, MOSFET's, NMOS transistors, GaAs FET's, JFET's, Darlington pairs, bipolar junction transistors, as well as others may be used in the switching regulator sensor circuit. An important design criteria is that the temperature coefficient ($\alpha$) be amenable to cancellation when utilized in the above equation or another equation derived from the use of the aforementioned device type.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for minimizing a temperature coefficient associated with a current limit in an output current that is provided to a load, the apparatus comprising:
    a comparator circuit that includes a first input that is arranged to receive a first signal, a second input that is arranged to receive a second signal, and an output that is arranged to provide an output signal in response to a comparison between the first input signal and the second input signal;
    a converter circuit that is arranged to produce a first current in response to a voltage reference signal, wherein the converter circuit has an associated first temperature coefficient;
    a first resistance circuit that is coupled to a transconductance circuit and arranged to produce the first signal in response to the first current, wherein the first resistance circuit has an associated second temperature coefficient;
    an output circuit that is arranged to provide the output current in response to a drive signal, and to provide a sense output signal that corresponds to a current level that is associated with the output current, wherein the sense output signal has an associated third temperature coefficient; and
    a second resistance circuit that is coupled to the second input of the comparator circuit and arranged to provide the second signal in response to the sense output signal such that the output signal changes logic states when the output current is at the current limit, and the first, second, and third temperature coefficients cancel one another with respect to the current limit.

2. The apparatus of claim 1, the first resistance circuit comprising at least one resistor that is a well type resistor.

3. The apparatus of claim 1, wherein the first, second, and third temperature coefficients are substantially 1000 ppm/° C., 6000 ppm/° C., and 5000 ppm/° C. respectively.

4. The apparatus of claim 1, the converter circuit further comprising a trans-conductance circuit that includes the first temperature coefficient.

5. The apparatus of claim 4, wherein the trans-conductance circuit includes a heavily doped resistor that has a temperature coefficient that corresponds to the first temperature coefficient.

6. The apparatus of claim 1, the converter circuit further comprising:
    an operational amplifier that includes an inverting terminal, a non-inverting terminal, and an output terminal;
    a transistor that includes a gate that is coupled to the output terminal of the operational amplifier, a source that is coupled to the inverting terminal of the operational amplifier, and a drain that is coupled to the first resistance circuit and the first input of the comparator circuit; and
    a third resistance circuit that is coupled between the source of the transistor and a circuit ground potential, wherein the third resistance has an associated temperature coefficient that corresponds to the first temperature coefficient, and the operational amplifier, transistor, and the third resistance are arranged to operate as a transconductance amplifier.

7. The apparatus of claim 1, the output circuit further comprising a voltage controlled current source that includes the associated third temperature coefficient.

8. The apparatus of claim 1, the output circuit further comprising:
    a first transistor that includes a gate that is coupled to the drive signal, a drain that is coupled to the first input of the comparator circuit, and a source that is coupled to the load; and
    a second transistor that includes a gate that is coupled to the drive signal, a drain that is coupled to a power supply, and a source that is coupled to the load, such that the first transistor and the second resistance circuit are configured to operate as a current sense circuit that provides the sense output signal as a sense current, and the second signal is a voltage that is determined by the sense current flowing through the second resistance circuit.

9. A method for reducing a temperature coefficient associated with a current limit in an output current that is provided to a load in a switching regulator, comprising:
    converting a voltage reference signal into a reference current based on a trans-conductance value that has an associated first thermal coefficient;
    producing a limit voltage in response to the reference current and a first resistance value, wherein the first resistance value has an associated second thermal coefficient;
    sensing the output current in an output circuit that produces a sense current that is related to the output current by a ratio, wherein the output circuit has an associated third temperature coefficient;
    producing a sense voltage in response to the sense current and a second resistance value; and
    comparing the limit voltage and the sense voltage to determine when the current limit is reached, wherein the first thermal coefficient, the second thermal coefficient, and the third thermal coefficient cancel one another with respect to the current limit.

10. An apparatus for reducing a temperature coefficient associated with a current limit in an output current that is provided to a load in a switching regulator, comprising:

a means for converting that is arranged to convert a voltage reference signal into a reference current based on a trans-conductance value that has an associated first thermal coefficient;

a means for producing a limit voltage that is arranged to provide a limit voltage in response to the reference current and a first resistance value, wherein the first resistance value has an associated second thermal coefficient;

a means for driving that is arranged to provide the output current to the load in response to a drive signal, wherein the means for driving has an associated third thermal coefficient;

a means for sensing that is responsive to the drive signal and arranged to produce a sense current that is related to the output current;

a means for producing a sense voltage that is arranged to produce a sense voltage in response to the sense current and a second resistance value; and a means for comparing that is arranged to compare the limit voltage and the sense voltage to determine when the current limit is reached, wherein the first thermal coefficient, the second thermal coefficient, and the third thermal coefficient cancel one another with respect to the current limit.

11. The apparatus of claim 10, the means for driving further comprising a voltage controlled current source that has a source resistance that includes the third temperature coefficient.

12. The apparatus of claim 10, wherein the means for sensing further comprising a voltage controlled current source that has a source resistance that has a value that is smaller than the second resistance value by at least a factor of ten.

13. An apparatus for minimizing a temperature coefficient associated with a current limit in an output current that is provided to a load, the apparatus comprising:

a comparator circuit that includes a first input that is arranged to receive a first signal, a second input that is arranged to receive a second signal, and an output that is arranged to provide an output signal in response to a comparison between the first input signal and the second input signal;

a transconductance circuit that is arranged to produce a first current in response to a voltage reference signal, wherein the transconductance circuit has an effective source resistance with an associated first temperature coefficient;

a first resistance circuit that is coupled to the transconductance circuit and arranged to produce the first signal in response to the first current, wherein the first resistance circuit has an associated second temperature coefficient;

an output circuit that is arranged to provide the output current in response to a drive signal, and to provide a sense output signal that corresponds to a current level that is associated with the output current, wherein the sense output signal has an associated third temperature coefficient; and a second resistance circuit that is coupled to the second input of the comparator circuit and arranged to provide the second signal in response to the sense output signal such that the output signal changes logic states when the output current is at the current limit, and the first, second, and third temperature coefficients cancel one another with respect to the current limit.

14. The apparatus of claim 13, the output circuit further comprising:

a first transistor that includes a gate that is coupled to the drive signal, a drain that is coupled to the first input of the comparator circuit, and a source that is coupled to the load; and a second transistor that includes a gate that is coupled to the drive signal, a drain that is coupled to a power supply, and a source that is coupled to the load, such that the first transistor and the second resistance circuit are configured to operate as a current sense circuit that provides the sense output signal as a sense current, and the second signal is a voltage that is determined by the sense current flowing through the second resistance circuit.

* * * * *